United States Patent [19]

Saito et al.

[11] Patent Number: 5,399,503
[45] Date of Patent: Mar. 21, 1995

[54] METHOD FOR GROWING A HGCDTE EPITAXIAL LAYER ON A SEMICONDUCTOR SUBSTRATE

[75] Inventors: Tetsuo Saito, Atsugi; Tetsuya Kochi, Isehara; Tamotsu Yamamoto, Isehara; Kazuo Ozaki, Isehara; Kosaku Yamamoto, Kawasaki, all of Japan

[73] Assignee: Fujitsu Limited, Kawasaki, Japan

[21] Appl. No.: 7,829

[22] Filed: Jan. 22, 1993

Related U.S. Application Data

[63] Continuation of Ser. No. 554,557, Jul. 19, 1990, abandoned.

[30] Foreign Application Priority Data

Jul. 19, 1989 [JP] Japan ................... 1-187990

[51] Int. Cl.$^6$ ............................................. H01L 31/18
[52] U.S. Cl. ................................... 437/2; 437/3; 437/5; 437/81; 437/84; 437/102; 437/126; 437/133; 437/965; 148/DIG. 64
[58] Field of Search .............. 437/2, 3, 5, 81, 84, 437/102, 105, 126, 133, 965; 148/DIG. 64, DIG. 169, DIG. 170; 156/DIG. 72, DIG. 82, DIG. 90

[56] References Cited

U.S. PATENT DOCUMENTS

| | | | |
|---|---|---|---|
| 3,619,283 | 11/1971 | Carpenter | 148/DIG. 64 |
| 3,725,135 | 4/1973 | Hager et al. | 437/3 |
| 4,317,689 | 3/1982 | Bowers et al. | 437/126 |
| 4,401,487 | 8/1983 | Lockwood | 437/5 |
| 4,418,096 | 11/1983 | Gauthier et al. | 427/76 |
| 4,435,224 | 3/1984 | Durand | 437/102 |
| 4,447,470 | 5/1984 | Kay | 427/76 |
| 4,487,813 | 12/1984 | Kay | 437/102 |
| 4,566,918 | 1/1986 | Irvine et al. | 156/DIG. 72 |
| 4,648,917 | 3/1987 | Kay et al. | 437/102 |
| 4,697,543 | 10/1987 | Abbott et al. | 437/119 |
| 4,846,926 | 7/1989 | Kay et al. | 437/102 |
| 4,853,078 | 8/1989 | Miyazaki | 156/DIG. 72 |
| 4,906,325 | 3/1990 | Bernardi | 156/DIG. 72 |

OTHER PUBLICATIONS

Journal of Vacuum Science Technology, vol. A5, No. 6, Nov. 1987, pp. 3383-3385, Fleming et al., "Control of the surface composition of isothermal vapor phase epitaxial mercury cadmium telluride".

Database Inspec. Institute of Electrical Engineers, 1824751, Koguchi et al., "Isothermal epitaxial growth of Hg/sub x/Cd/sub 1-x/Cr/sub 2/Se/sub 4/solic-solution thin films on CdCr/sub 2/Se/sub 4/single crystal substrates" & Journal of the Japan Institute of Metals, Japan, vol. 45, No. 7, Jul. 1981, pp. 740–745. GB–A–929 865 (International Business Machines Corp.), p. 1, line 18–line 74.

Chinese Physics, Jul.-Sep., vol. 8, No. 3, pp. 804–807, Kong, et al., "Growth of epitaxial films of the ternary compound Hg1xCdxSe by using vaport transport technique".

*Primary Examiner*—Nam Nguyen
*Assistant Examiner*—Ramamohan Rao Paladugu
*Attorney, Agent, or Firm*—Staas & Halsey

[57] ABSTRACT

A method for growing an epitaxial layer of a group II-VI tenary or quaternary compound on a substrate. In particular a HgCdTe semiconductor layer is grown on a substrate such as sapphire which does not interdiffuse with the materials in the semiconductor layer. Initially a crystalline CdTe semiconductor layer is formed on the substrate and then the substrate with the CdTe layer thereon is placed into an enclosure along with a Hg-Cd-Te source that is rich in Te. The substrate and the source are then heated so as to establish three-phase equilibrium conditions in the enclosure whereby vapors from the source are transported to the CdTe layer and the latter is converted into a ternary semiconductor compound having the composition $Hg_{1-x}Cd_xTe$. The substrate with the $Hg_{1-x}Cd_xTe$ epitaxial layer thereon is useful as a sensing device.

8 Claims, 7 Drawing Sheets x' VALUE OF GROWN $Hg_{1-x'}Cd_{x'}Te$ LAYER

DISTANCE FROM SURFACE (μm)

FIG. 5(a)
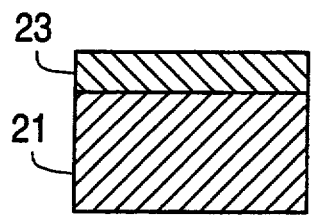
FIG. 5(b)
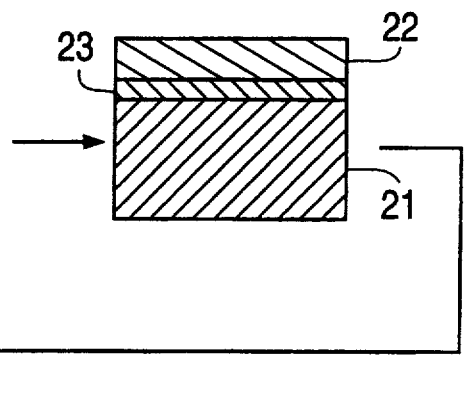
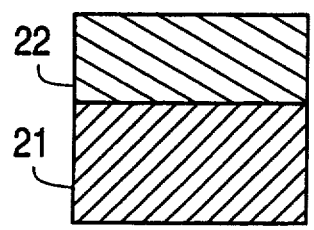
FIG. 5(c)
FIG. 6
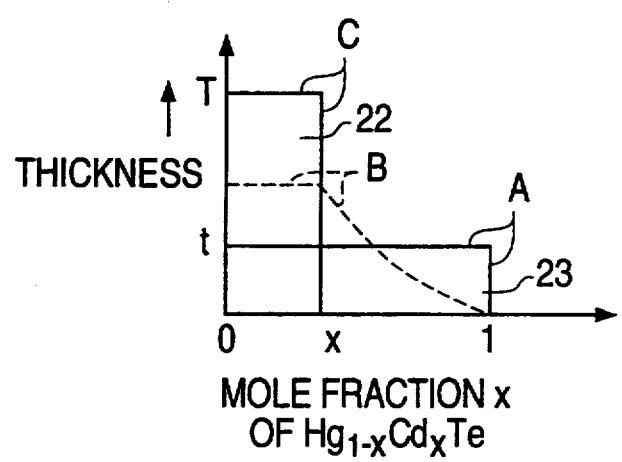

METHOD FOR GROWING A HGCDTE EPITAXIAL LAYER ON A SEMICONDUCTOR SUBSTRATE

This application is a continuation of application Ser. No. 07/554,557, filed Jul. 19, 1990, now abandoned.

BACKGROUND OF THE INVENTION

1. Field of the Invention

The present invention relates to a method for growing a ternary or quaternary group II-VI compound semiconductor layer having a precisely controlled composition by vapor phase epitaxy and a product using the same. More particularly, the invention relates to a method for growing an epitaxial layer of mercury cadmium telluride (HgCdTe) on a sapphire substrate, and to a sensitive device incorporating the HgCdTe layer on the sapphire substrate. 2. Description of the Related Art Well known conventional methods for growing HgCdTe layers are first explained using schematic FIGS. 1(a) and 1(b). As shown in FIG. 1(a), a cadmium telluride (CdTe) substrate 2 on which a HgCdTe layer is to be grown and a source 1 comprising a melt of mercury (Hg), cadmium (Cd) and tellurium (Te) elements are disposed at opposite respective ends in a tubular enclosure 3. FIG. 1(b) is an illustration of a temperature distribution curve 4 showing the temperature at corresponding positions of FIG. 1(a) after the tubular enclosure 3 has been put into a furnace(not shown). Source 1 is first prepared by providing the above three elements, and the weight of each element in the source is determined so as to satisfy the stoichiometric composition of the $Hg_{1-x}Cd_xTe$ layer. The three elements are mixed, melted and finally solidified to form the source 1. In a stoichiometric composition the total amount of mercury and cadmium atoms is substantially equal to the total amount of tellurium atoms, and each of the mercury and cadmium atoms is combined with a tellurium atom so as to form both HgTe and CdTe.

As shown in FIG. 1(b), the temperature of source 1 is about 600° C. and this temperature is a little higher than the temperature of other regions in enclosure 3 by about 10° C. Under these conditions, the vapor pressure inside tubular enclosure 3 is greater than about 8 atm, and in order to avoid the danger of enclosure breakage, the dimensions of tubular enclosure 3 and of the substrate 2 cannot be sufficiently large.

J. G. Fleming et al., in their paper "Control of the surface composition of isothermal vapor phase epitaxial mercury cadmium telluride", J Vac Sci Technol A5(6), November/December 1987, disclose a method for controlling the surface composition of a mercury cadmium telluride system during isothermal vapor phase epitaxy of mercury cadmium telluride. The method employs a source in three-phase (solid-liquid-vapor) equilibrium for the desired composition and by using this method it is possible to avoid the high vapor pressure conditions of the prior art. The Fleming et al. method and composition profiles of the layers grown thereby are outlined in FIGS. 2 and 3.

FIG. 2 presents a cross-sectional view of the structure used for the tests. The structure comprises a quartz ampoule 5 and a quartz cover plug 10 forming an enclosure. A tellurium-rich source 6 is disposed at the bottom of the ampoule 5, and a CdTe substrate 8 is held in a fixed position above the source 6 with the spacing therebetween determined by quartz spacers 7 as shown.

The tellurium-rich source 6 plays an important role in the growth of the mercury-cadmium-tellurium layer. The source 6 comprises a solid mass of stoichiometric mercury cadmium telluride having the composition $Hg_{1-x}Cd_xTe$ and a tellurium-rich (hereinafter abbreviated as Te-rich) liquid consisting of a non-stoichiometric mercury cadmium telluride mixture having a composition of $(Hg_{1-z}Cd_z)_{1-y}Te_y$ wherein the Te-rich liquid is defined by a value of y which is larger than 0.5. The ratio of solid to liquid is about 9/1. At the growth temperature, the source is maintained in three phase solid-liquid-vapor equilibrium.

FIG. 3 shows the composition profile of the thusly grown layers. The distance from the growth surface is plotted along the abscissa and the x'-value of epitaxial $Hg_{1-x'}Cd_{x'}Te$ layers grown using different source compositions is plotted along the ordinate. The x-values shown in FIG. 3 for curves 11 through 16 are the x-values of the solid $Hg_{1-x}Cd_xTe$ composition used as the three-phase solid-liquid vapor equilibrium source.

As can be seen from FIG. 3, when the parameter x of the solid in the source is equal to 0.2 the x' values of the grown layers are always larger than 0.2. Even in the extreme case where x=0, which means that the source comprises solid mercury telluride (HgTe) and Te-rich liquid mercury telluride, the grown layer comprises a cadmium component ($x' \geq 0.12$) and has a composition represented by the formula $Hg_{0.88}Cd_{0.12}Te$. Thus, when the foregoing method is used, it is not possible to grow mercury cadmium telluride epitaxial layers wherein the mole fraction of CdTe is equal to or less than 0.11. That is to say, it is not possible to grow $Hg_{1-x}Cd_xTe$ layers having an x-value that is 0.11 or less.

Fleming's method for growing HgCdTe epitaxial layers as outlined above utilizes a source comprising a mixture of a solid stoichiometric HgCdTe compound having a predetermined composition and a Te-rich liquid HgCdTe melt wherein the components are in three-phase equilibrium at the growth temperature. The preparation of source materials which will grow an epitaxial $Hg_{1-x}Cd_xTe$ layer on a CdTe substrate, wherein the layer will have specified mole fraction x of CdTe in the ternary $Hg_{1-x}Cd_xTe$ compound, necessitates complicated process steps. When the composition of the grown layer is to be changed, each of the source materials must be prepared again.

SUMMARY OF THE INVENTION

It is a general object of the invention, therefore to provide a method for growing a $Hg_{1-x}Cd_xTe$ epitaxial layer utilizing a single source comprising a Te-rich Hg-Cd-Te melt.

It is a more specific object of the invention to provide a method of growing a $Hg_{1-x}Cd_xTe$ epitaxial layer, wherein the value of mole fraction x can be arbitrary controlled by controlling growth temperature.

It is another object of the invention to provide a method of growing a $Hg_{1-x}Cd_xTe$ epitaxial layer, wherein the vapor pressure inside the growth ampoule enclosing the source and substrate is reduced, whereby it is possible to use an ampoule with a larger diameter and a correspondingly larger substrate.

It is still another object of the invention to provide a method of growing a $Hg_{1-x}Cd_xTe$ epitaxial layer on a sapphire substrate, wherein the epitaxial layer has an extremely uniform composition throughout the entire thickness.

It is still a further object of the invention to provide a sensing device which includes a $Hg_{1-x}Cd_xTe$ epitaxial layer that has been grown by the method of the invention.

The foregoing and related objects are achieved through the use of the invention which provides a method that comprises the steps of:

a) providing a substrate that is formed from a material such as sapphire which does not interdiffuse with the semiconductor layer to be deposited thereon, b) forming a crystalline semiconductor layer on the substrate by a conventional method, said crystalline semiconductor layer being composed of at least two of the elements included in an epitaxial layer of the ternary semiconductor compound to be grown thereon, c) providing a source comprising all of the elements to be included in said ternary compound, said melt containing a stoichiometric excess of at least one of the components of the ternary compound, d) placing the source and the substrate with the crystalline semiconductor layer thereon in an enclosure, e) heating the substrate and source at a predetermined temperature and growing a ternary semiconductor on the crystalline layer under three-phase equilibrium conditions, f) maintaining the three-phase equilibrium conditions until the entire crystalline layer is converted into an epitaxial ternary semiconductor layer having a predetermined composition.

The invention further relates to methodology for growing ternary and quaternary semiconductor layers and to sensing devices produced by such methods.

Other objects and advantages of the present invention will become apparent from the detailed description to follow taken in conjunction with the appended claims.

BRIEF DESCRIPTION OF THE DRAWINGS

FIGS. 1(a) and 1(b) illustrate a method for growing prior art HgCdTe epitaxial layers, wherein FIG. 1(a) is a schematic cross-sectional view of an enclosure for layer growth, and FIG. 1(b) is a chart illustrating the temperature distribution within the enclosure of FIG. 1(a) during layer growth, FIG. 6 shows the relationship between growth thickness and the x-value of the grown epitaxial layer, FIG. 7 graphically illustrates the liquidus isotherms and solidus lines for the Te-rich corner of a Hg-Cd-Te system, FIG. 8 graphically illustrates the partial pressure curves of Hg along the three-phase equilibrium curves for various solid solutions.

DETAILED DESCRIPTION OF THE PREFERRED EMBODIMENTS

Figure 1A:
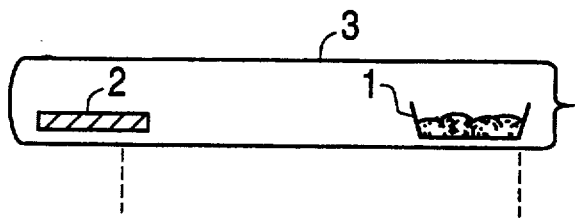
Figure 1B:
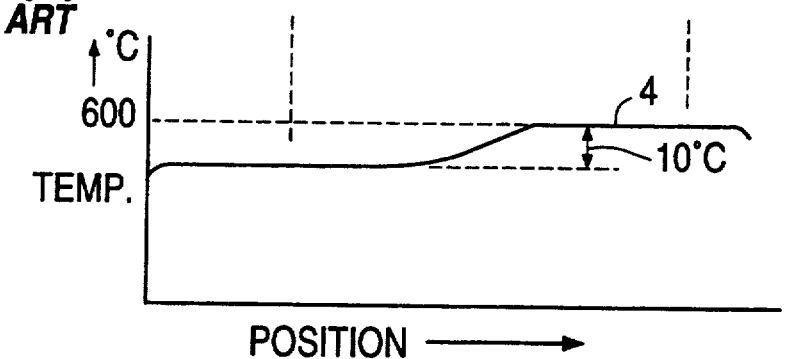
Figure 2:
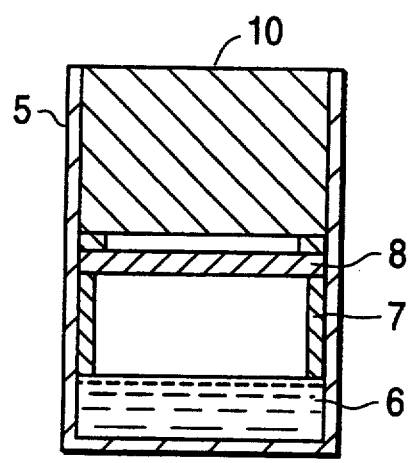
FIG. 2 is a cross-sectional elevational view of an enclosure used for growing prior art HgCdTe layers, FIG. 3 graphically illustrates the compositional profiles of HgCdTe layers grown by the method of FIG. 2, in which the abscissa represents the distance from the grown surface and the ordinate represents the $x'$-values of the grown epitaxial $Hg_{1-x'}Cd_{x'}Te$ layers when different values of x are used in the source.
Figure 3:
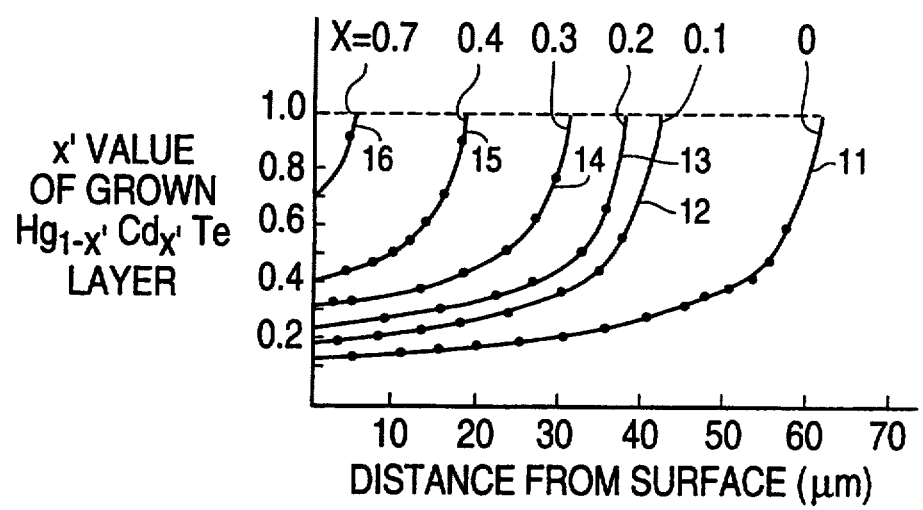
Figure 4:
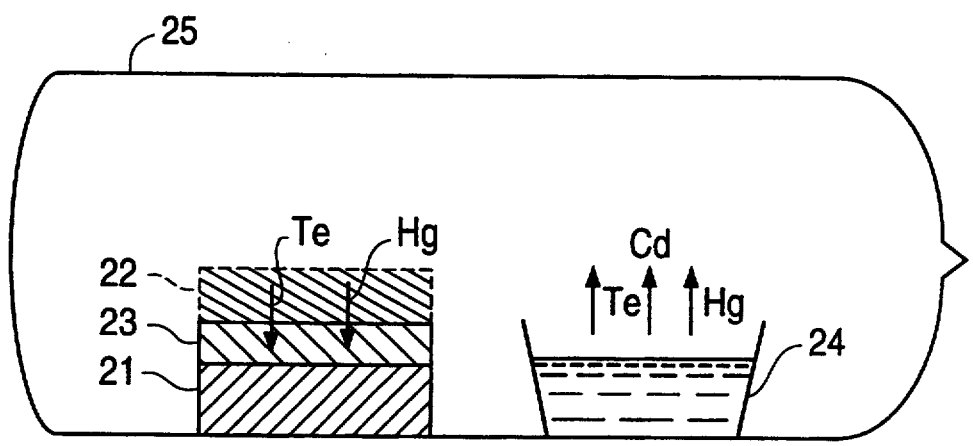
FIG. 4 is a schematic cross-sectional view of an enclosure for explaining the principles of the present invention and in which a substrate and a source are illustrated, FIGS. 5(a), (b) and (c) are cross-sectional views schematically illustrating the step by step growth of an epitaxial layer on a substrate in accordance with the present invention.

The principles of the present invention are first explained using FIG. 4. On a sapphire ($Al_2O_3$) substrate 21, a CdTe crystalline layer 23 is grown in advance. The substrate 21 with the CdTe crystalline layer 23 thereon is disposed in a quartz ampoule 25. A source 24 comprising a Te-rich mercury cadmium telluride melt in a container is also disposed in the ampoule 25 at a location which is separated from the substrate 21. The composition of the Te-rich mercury cadmium telluride melt of source 24 which is used for growth is expressed by the molecular formula $(Hg_{1-x}Cd_x)_{1-y}Te_y$ in which y is larger than 0.5. The source is made by providing a specified amount of each of the three component elements, mixing the elements, heating the mixture to melt and finally cooling the mixture to solid state. Such source is generally called a melt, regardless of its actual state or phase, and even when the source is in a solid state.

The ampoule 25 is heated in a furnace (not shown) and the temperature inside the ampoule is brought to the liquidus temperature $T_1$ of the Te-rich Hg-Cd-Te melt. At the liquidus temperature $T_1$, the source 24 comprises a stoichiometric HgCdTe solid phase and a Te-rich HgCdTe liquid phase, and each component element is vaporized to develop partial pressure of Hg, Te and Cd within ampoule 25. The partial pressure of Hg is predominant and the partial pressure of Te is next. The solid CdTe layer 23 and the source 24 which includes both solid and liquid phases are in three-phase equilibrium with the vapor phase containing vaporized Hg, Cd and Te intervening therebetween.

FIG. 5 schematically illustrates the progress of the growth on the substrate 21. At the liquidus temperature $T_1$, a solid stoichiometric $Hg_{1-x}Cd_xTe$ phase having a specified mole fraction x precipitates from a Te-rich HgCdTe liquid phase having a predetermined composition.

Component elements vaporized at the source are transported to the CdTe crystalline layer 23, where they react with the layer and cause isothermal growth to take place. The thermodynamic theory teaches that a HgCdTe layer grown on the CdTe layer 23 in three-phase equilibrium tends finally to produce a HgCdTe layer having substantially the same composition as the precipitated $Hg_{1-x}Cd_xTe$ solid in the source. Therefore, as seen in FIG. 5(b), transported Hg and Te molecules react with the CdTe layer and interdiffusion of molecules take place so as to partly erode the original CdTe crystal layer 23 and cause growth of a HgCdTe layer 22 having a composition which changes gradually from the surface downwardly. The reaction continues until the entire grown layer 22 is completely transformed into an epitaxial layer 22 having the composition of $Hg_{1-x}Cd_xTe$, as shown in FIG. 5(c).

Strictly speaking, the distinct boundary surface between original CdTe layer 23 and grown layer 22 in FIG. 5(b) cannot be seen. As shown in FIG. 6, the mole fraction x measured along the thickness direction varies gradually. At the beginning of the growth, CdTe layer 23 has an original thickness t and the x-value is unity as shown by two crossing lines A. During the growth, the thickness and x-value are shown by a line and curve B. At the end of growth, they are shown by two crossing lines C.

In the present invention, the thickness t of the initial CdTe layer 23 is selected to be sufficiently thin to enable the entire growth process to be finished in a reasonable time. When the lattice constants of CdTe and $Hg_{1-x}Cd_xTe$ are assumed to be $a_1$ and $a_2$ (for a given mole fraction x) respectively, the thickness of the grown $Hg_{1-x}Cd_xTe$ layer can be calculated by the equation, $$T = (ta_2)/(xa_1).$$

Figure 7:
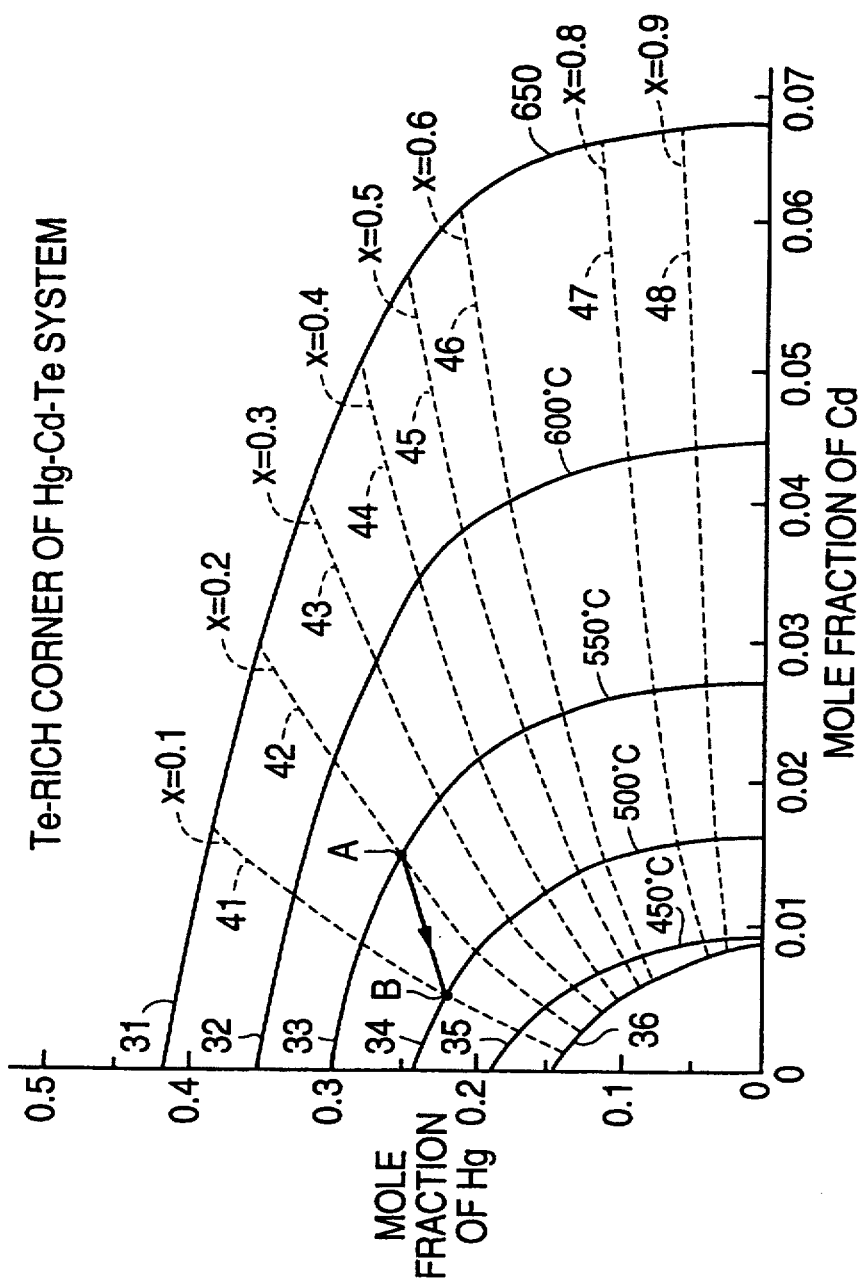
Figure 8:
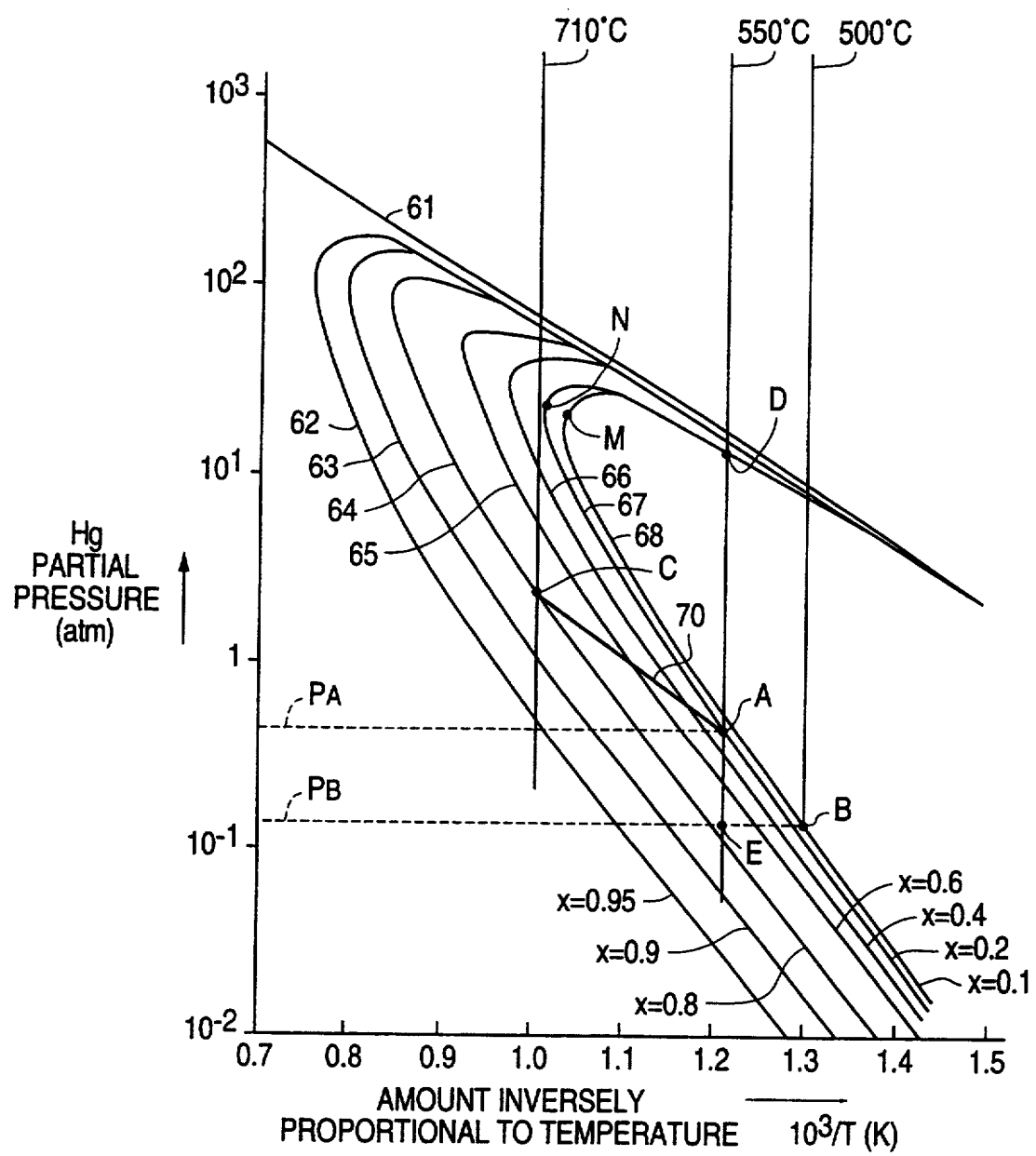

A more detailed analysis of the growth is provided by FIGS. 7 and 8. FIG. 7 shows the liquidus isotherms and solidus lines for the Te-rich corner of the Hg-Cd-Te system. FIG. 8 shows the partial pressure curves for Hg along the three-phase equilibrium curves for various solid solutions.

Curves in these Figures are similar to those reported in the following references; however, the curves of FIGS. 7 and 8 have been modified for easy application to the present invention.

T. C. Harman, "Liquidus isotherms, solidus lines and LPE growth in the Te-rich corner of Hg-Cd-Te system" *J. of Electronic Materials*, Vol. 9, No. 6, 1980, and T Tung, et al. "Measurement and analysis of the phase diagram and thermodynamic properties in the Hg-Cd-Te system", *J. Vac. Sci, Technol.*, Vol. 21, No. 1, May/June 1982.

In FIG. 7, the abscissa represents the mole fraction of Cd in the Hg-Cd-Te system, and the ordinate represents the mole fraction of Hg. Thus, when the melt is expressed by the formula $(Hg_{1-z}Cd_z)_{1-y}Te_y$, the abscissa and ordinate positions respectfully are $z(1-y)$ and $(1-z)(1-y)$. Solid curves 31 through 36 represent liquidus isotherms, and dashed curves 41 through 48 represent solidus lines when solids are expressed as $Hg_{1-x}Cd_xTe$, taking the mole fractions x of CdTe as parameters.

Point A in FIG. 7 is the point where the 550° C. liquidus isotherm crosses the solidus line where x is equal to 0.2. The abscissa and ordinate data for point A, which are determined from FIG. 7 to be 0.014 and 0.25 respectively, show that the liquid phase alloy composition $Hg_{0.25}Cd_{0.014}Te_{0.736}$ will be in equilibrium at a temperature of 500° C. with a solid phase having a composition of $Hg_{0.8}Cd_{0.2}Te$. Because the system is in three-phase equilibrium, growth of an alloy having a composition of $Hg_{0.8}Cd_{0.2}Te$ will occur on a separately located CdTe substrate located in the system.

When the temperature of the system is gradually decreased to about 500° C., the equilibrium point will move toward point B in FIG. 7. The CdTe mole fraction x of the solid phase composition which separates from the melt changes from 0.2 toward 0.1. Under equilibrium conditions at 500° C., a $Hg_{0.9}Cd_{0.1}Te$ solid phase will separate from the melt. This illustrates that a $Hg_{1-x}Cd_xTe$ epitaxial layer wherein the x-value is less than 0.11 can be grown by the present invention.

FIG. 8 shows the partial pressure of Hg for various conditions in a three-phase equilibrium Hg-Cd-Te system. The abscissa represents values which are inversely proportional to the system temperature. Straight line 61 shows the vapor pressure of Hg when liquid Hg is heated by itself in an enclosure. Curves 62 through 68 show the partial pressures of Hg when the specified x-value points are connected and, along each curve, the CdTe mole fraction x of the separated solid $Hg_{1-x}Cd_xTe$ is constant. Points A and B correspond to the points A and B respectively of FIG. 7. Point A is located on curve 67 (x=0.2) and the line for 550° C. in FIG. 8, and point B is located on curve 68 (x=0.1) and the line for 500° C. The partial pressure of Hg, which is predominant over other component vapors, has a moderate value and the danger of ampoule explosion is thus reduced.

Turnover points M and N in FIG. 8 indicate points when stoichiometric melts are utilized, the melt for points M and N corresponding to mole fractions (x) of 0.1 and 0.2 respectively. At these points satisfying stoichiometric conditions, the mole fractions of the liquid melt and of the separated solid phase HgCdTe are the same. Portions of the curve which are lower than the stoichiometric points correspond to Te-rich melts, and the upper portions which are asymptotic to line 61 correspond to Hg-rich melts.

When the temperature of the system is raised from 550° C. (point A) to 710° C., the equilibrium position in FIG. 8 moves to point C along the line 70 which is almost parallel to line 61. At point C, the solid composition in the melt has the formula $Hg_{0.2}Cd_{0.8}Te$.

The growth method of the present invention as described above shows that a variety of epitaxial HgCdTe layers have different compositions can be grown using a single Te-rich melt by controlling the growth temperature. Under conditions such that the substrate and source are maintained at substantially the same temperature, the x-value of the grown epitaxial layer can be caused to cover a wide range from less than 0.11 to greater than 0.8 by changing the system temperature, and at the same time the pressure of the system may considerably reduce to around or less than 1 atm.

Further, the present invention may be extended to a case in which the substrate is heated to a predetermined fixed temperature and the melt is maintained at a different temperature from that of the substrate, resulting in the possibility of controlling the x-value of the grown epitaxial $Hg_{1-x}Cd_xTe$ layer.

For example, when the system is under conditions such that the temperatures of the source and the substrate are each maintained at 550° C. and the separated solid phase in the source melt and the grown $Hg_{1-x}Cd_xTe$ layer each have an x-value of about 0.2 (point A of FIG. 8), the partial pressure of Hg is shown by the dashed line $P_A$ in FIG. 8.

In a first case, when the source temperature is reduced to 500° C. (point B of FIG. 8) but the substrate is maintained at a temperature of 550° C., when the separated solid phase in the melt has an x-value of 0.1 and the partial pressure of Hg in the system is shown by the dashed line $P_B$ in FIG. 8. However, the composition of the epitaxial layer grown on the substrate, which is grown under equilibrium conditions at the partial pressure Ps and the substrate temperature of 550° C., has an x-value of 0.7 which is shown by a point E (the crossing point of the $P_B$ and 550° C. lines). The difference in the x-value is remarkable.

In a second case, when the substrate temperature is fixed at 550° C. and the source temperature is raised to a level higher than 550° C., the composition of the melt and the Hg partial pressure P in equilibrium therewith move along the line 70. However, because the substrate is held at a fixed temperature of 550° C., the layer grown on the substrate surface has a composition which is in equilibrium with this higher partial pressure $P_H$. This means that the x-value of the epitaxial layer grown on the substrate under equilibrium conditions varies toward 0, but the x-value cannot be less than 0.

The x-value can approach 0 and, in the extreme case, it becomes 0, and thus illustrates a condition which is equivalent to a Te-rich HgTe system in equilibrium. Thus, in the second case, the source temperature, or the partial pressure P can be controlled to a value which is the same as that which is obtained in a Te-rich HgTe system under equilibrium conditions at the same substrate temperature.

As described above, a melt having a constant composition may be used to prepare a variety of epitaxial layers having different x-values. Accordingly, there is no need to prepare melts having different compositions in order to produce sensing devices having different sensitivity and/or wavelength characteristics.

In the embodiment of the present invention, a sapphire ($Al_2O_3$) substrate 21 having dimensions of 25×30×0.04 mm is provided. A CdTe crystalline layer 23 is separately grown on the sapphire substrate 21. The thickness of the CdTe crystalline layer may range from 3 to 4 microns. The growth method may be any one of a variety of known technologies such as MOCVD (Metal Organic Chemical Vapor Deposition), Hot-Wall Epitaxial growth, or PVD (Physical Vapor Deposition), however, the details of such known methods are omitted here.

The grown CdTe crystalline layer 23 does not need to be of a mono-crystalline structure. The thickness of the layer 23 is determined taking the following factors into consideration. When a $Hg_{1-x}Cd_xTe$ epitaxial layer is grown on the CdTe crystalline layer 23 in a Hg-Cd-Te system which is three-phase equilibrium in accordance with the present invention, the two layers interact with each other at the interface region and interdiffusion takes place, and finally the entire original CdTe crystalline layer 23 is converted to a $Hg_{1-x}Cd_xTe$ crystalline structure which is integrated with the subsequently grown $Hg_{1-x}Cd_xTe$ phase to thus form a single epitaxial $Hg_{1-x}Cd_xTe$ layer. Therefore, the greater the initial thickness of the CdTe layer 23, the longer the necessary growth period. In the present embodiment, a 3 micron thickness is selected for the CdTe layer 23.

Figure 9:
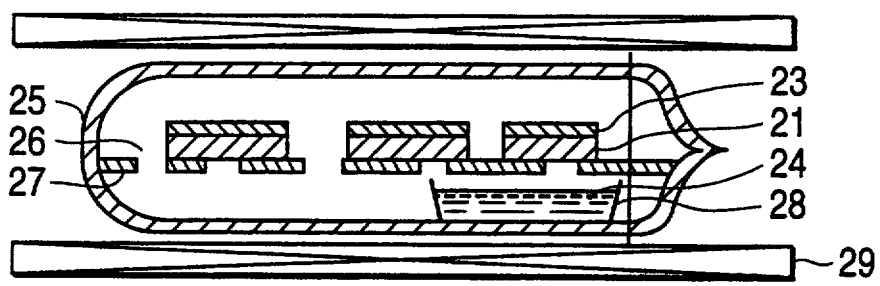
FIG. 9 is a schematic cross-sectional view of a growing apparatus used in conducting the methods of the present invention, FIG. 10 graphically illustrates the temperature distribution along the axis of the enclosure of FIG. 9.

FIG. 9 is a schematic cross-sectional view of an apparatus used for conducting an embodiment of the invention. The sapphire substrates 21 with CdTe layers 23 thereon are disposed on a quartz holder 27 having openings 26, and the substrate holder 27 is arranged in a quartz enclosure 25. A source 24 contained in a boat 28 is provided beneath the substrate holder 27. Finally, the enclosure 25 is evacuated and placed in a furnace 29. The source 24 comprises a Te-Rich Hg-Cd-Te melt which has a composition which is expressed in atomic mole fraction formula as $Hg_{0.248}Cd_{0.014}Te_{0.738}$. When this composition is defined in terms of the formula $(Hg_{1-z}Cd_z)_{1-y}Te_y$, then y=0.738 and z=0.055. This melt composition corresponds to point A in FIG. 7.

Figure 10:
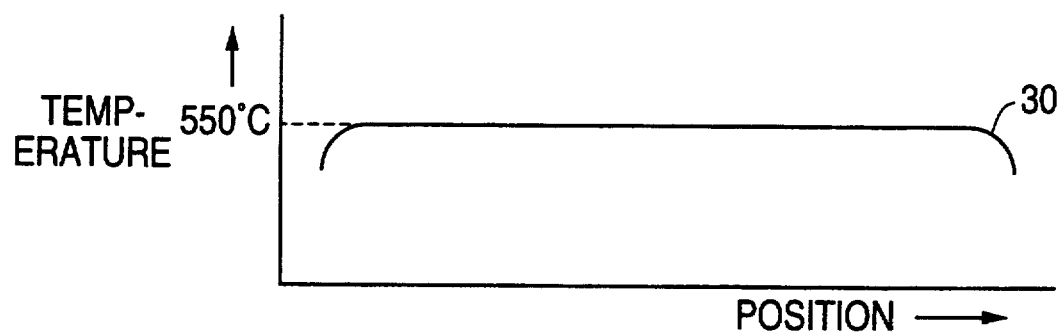

The enclosure 25 is heated to about 550° C. in the furnace 29 and is maintained at this temperature for three days. The temperature distribution along the axis of the enclosure is shown by the curve 30 in FIG. 10. After the three day heating period, the enclosure is cooled to room temperature over a period of one hour. When the enclosure is opened and the substrates 21 are removed, it is found that an epitaxial layer having a composition of $Hg_{0.8}Cd_{0.2}Te$ and a thickness T of about 15 microns has been grown on each sapphire substrate 21.

As explained previously, the thickness T is determined by the equation $T=(ta_2)/xa_1$. The lattice constant $a_1$ of CdTe is known to be 6.482 Å and the lattice constant $a_2$ of $Hg_{0.8}Cd_{0.2}Te$ is 6.468 Å. Accordingly, the ratio $a_1/a_2$ is almost unity. Since x is 0.2 in this case, the thickness T should be about 5t. The actual grown thickness of about 15 microns agrees well with the object of the present invention.

In determining the initial thickness t of the CdTe crystalline layer 23, the growth time and growth temperature should be taken into consideration. When a growth temperature between 480° C. and 600° C. is specified and a growth time of less than several tens of hours is required, the thickness t should be less than 10 microns and preferably should be in the range of from 2 to 5 microns.

Figure 11:
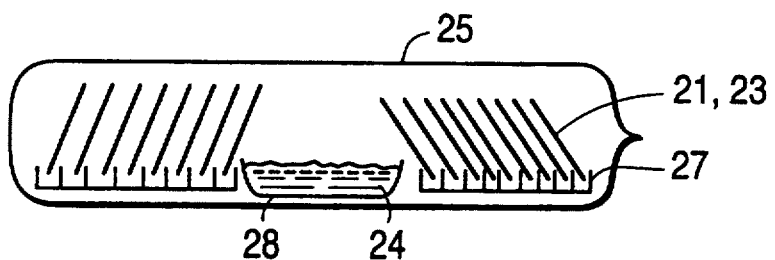
FIG. 11 illustrates a modified arrangement of substrates and source in an enclosure in accordance with the present invention.

The arrangement of the substrates and the source may be modified as shown in FIG. 11. In FIG. 11, a boat 28 containing a Te-rich Hg-Cd-Te melt is provided at the center portion of an enclosure 25. Substrate holder 27 accommodates a plurality of sapphire substrates 21 having CdTe crystalline layers 23 thereon. The substrates are equally spaced and are disposed on both sides of boat 28.

Figure 12:
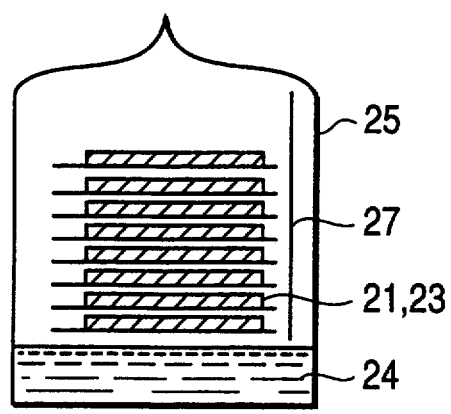
FIG. 12 illustrates another modified arrangement of substrates and source in an enclosure in accordance with the present invention.

Another modified arrangement is shown in FIG. 12, in which source 24 is provided at the bottom of vertical-type enclosure 25 and a substrate holder 27 supports a plurality of sapphire substrates 21 having CdTe crystalline layers 23 thereon.

Figure 13A:
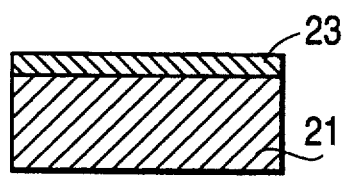
FIGS. 13(a) to 13(d) are cross-sectional views of the developing substrate corresponding to the sequential steps used for forming a pattern HgCdTe layer on a substrate in accordance with the present invention.
Figure 13B:
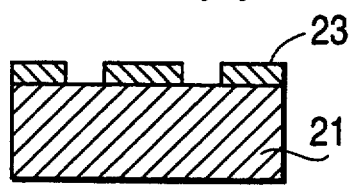
Figure 13C:
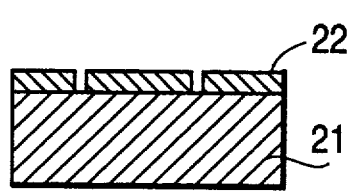

The present invention can be easily modified to form a pattern HgCdTe layer on a sapphire substrate. FIGS. 13(a) to 13(c) show the steps therefor. The preliminary step is the same as previously explained, and a CdTe crystalline layer 23 is formed on a sapphire substrate 21 as shown in FIG. 13(a). A resist layer (not shown) is formed on the layer 23 on substrate 21 and is patterned by a conventional photolithography method. Using the patterned resist layer as a mask, the CdTe crystalline layer 23 is patterned as shown in FIG. 13(b). The substrates are put in an enclosure for growing HgCdTe layers in the same way as explained previously. The growth method is vapor-phase epitaxy, and therefore, a $Hg_{0.8}Cd_{0.2}Te$ epitaxial layer 22 is selectively grown on sapphire substrate 21 and integrated with the pattern CdTe crystalline layer 23 as shown in FIG. 13(c). This method is particularly effective in producing a multi-element sensing device.

Figure 13D:
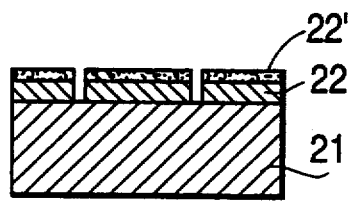

Further, the present invention may be applied for producing a quality sensing device in which the sweepout phenomenon is eliminated. The sweepout phenomenon is the saturation tendency in a detected-signal-voltage verses bias-voltage characteristics. This type of sensing device is obtained by forming a structure where the surface of the epitaxial layer of $Hg_{0.8}Cd_{0.2}Te$ 22 of FIG. 13(c) is covered by a thin layer 22' of $Hg_{0.5}Cd_{0.5}Te$ as shown in FIG. 13(d).

The method of fabricating such a sensing device is explained with reference to FIGS. 13(c) and 13(d). After the structure of FIG. 13(c) is obtained as described above, the system temperature is varied from a three-phase equilibrium condition to a condition such that the substrate temperature is reduced to, for example, 500° C., and the source temperature is further reduced to 470° C. This condition is maintained for an hour and thereafter the enclosure is cooled rapidly. A thin epitaxial layer 22' having a composition of $Hg_{0.5}Cd_{0.5}Te$ is grown on the $Hg_{0.8}Cd_{0.2}Te$ layer 22 as shown in FIG. 13(d). The sensing device thus obtained has a high quality without a sweepout phenomenon.

The method of the present invention employs a growing method in a three-phase equilibrium system and the deposited molecules are transported to the growth substrate in vapor-phase. Therefore, even when the substrate has an uneven growth surface, the growth is not influenced by such surface unevenness.

The required time for growing an epitaxial layer in accordance with the present invention may effectively be shortened when the growth temperature in the enclosure is raised to $T_u$, a temperature which is higher than the liquidus temperature $T_1$ of the Te-rich Hg-Cd-Te melt. The temperature is maintained at $T_u$ for a predetermined period and thereafter the temperature is reduced and maintained at the liquidus temperature $T_1$.

On the other hand, when the growth temperature is maintained at a temperature $T_4$ which is lower than the liquidus temperature $T_1$ of the Te-rich Hg-Cd-Te melt, the three-phase equilibrium conditions are changed such that the x-value of the grown epitaxial layer becomes less than the x-value which is obtained under three-phase equilibrium conditions at temperature $T_1$.

Thus it is possible to grow HgCdTe epitaxial layers having different mole fraction x-values simply by changing the growth temperature in systems wherein a single Te-rich Hg-Cd-Te melt having a predetermined composition is utilized.

In the above embodiments, a sapphire substrate 21 having a CdTe crystalline layer thereon is used as a substrate for growing a $Hg_{1-x}Cd_xTe$ epitaxial layer. However, the present invention is not restricted to such substrates. A sapphire substrate with a $Hg_{1-x'}Cd_{x'}Te$ crystalline layer thereon can also be used as a substrate, and an epitaxial $Hg_{1-x}Cd_xTe$ layer can be grown on such sapphire substrate in which the mole fraction x-value of the desired grown layer is different from the x'-value of the layer which was initially formed on the substrate. Such growth methods are almost the same as those explained above.

Further, substrates formed from magnesium oxide (MgO), zirconium oxide (ZrO), magnesium aluminum oxide (MgO·Al$_2$O$_3$) or silicon covered with silicon oxide (SiO$_2$) can be used as substitutes for the sapphire substrates described above. The necessary condition for the substrate material is that the substrate does not interdiffuse with the epitaxial layer to be formed thereon.

All embodiments so far described relate to the method of growing epitaxial layers from ternary compounds having a composition of $Hg_{1-x}Cd_xTe$. When the composition of the ternary compound of the epitaxial layer is defined as $A_{1-x}B_xC$, the present invention can be applied for all ternary compounds wherein A is Hg, B is selected from among Cd, Zn, Mn and Fe, and C is selected from among Te, S and Se.

Further the present invention may be extended to include a method for growing an epitaxial layer of a group II-VI quaternary compound semiconductor having a composition of, for example, $Hg_{1-x-z}Cd_xZn_zTe$ or $Hg_{1-x}Cd_xTe_{1-z}Se_z$.

A method for growing a $Hg_{1-x-z}Dc_xZn_zTe$ epitaxial layer is briefly explained hereinafter. A CdTe crystalline layer if first grown on a sapphire substrate, and next a ZnTe crystalline layer is grown on the CdTe crystalline layer. The ratio of the thickness of the CdTe layer to the thickness of the ZnTe layer is chosen to be about x/z. The substrate with these two layers thereon is placed in an enclosure with a source of a Te-rich melt comprising Hg, Cd, Zn and Te elements. The enclosure is heated to a predetermined temperature and the substrate and source are subjected to isothermal vapor-phase epitaxy in three-phase equilibrium, resulting in the growth of a $Hg_{1-x-z}Cd_xZn_zTe$ epitaxial layer on the sapphire substrate.

Another method of growing an epitaxial $Hg_{1-x}Cd_xTe_{1-z}Se_z$ layer comprises the steps of: (a) forming a CdTe crystalline layer on a sapphire substrate, (b) growing an $Hg_{1-x}Cd_xTe$ layer on the sapphire substrate in the same way as previously disclosed, (c) placing the substrate with the CdTe and $Hg_{1-x}Cd_xTe$ layers thereon and a source comprising an off-stoichiometric melt containing Hg, Cd, Te and Se elements in an enclosure and heating the enclosure to establish conditions for isothermal vapor-phase epitaxy in three-phase equilibrium, whereby a $Hg_{1-x}Cd_xTe_{1-z}Se_z$ epitaxial layer is grown on the sapphire substrate.

The general concepts for growing quaternary compound semiconductor layers having compositions of $(A_{1-x}B_x)_{1-y}B'_yC$ (first quaternary compounds) or $A_{1-x}B_xC_{1-z}C'_z$ (second quaternary compounds) are explained next. In the foregoing formulas, B and B' are different and each is selected from among Cd, Zn, Mn and Fe, and C and C' are different and each is selected from among Te, S and Se.

A crystalline layer represented by a chemical formula BC is first grown on a sapphire substrate, the thickness of the grown layer being denoted as t. Next, the substrate with the BC layer thereon and a source are placed in an enclosure. The source comprises an off-stoichiometric melt composed of A, B and C elements, wherein A is Hg and B and C are as defined previously. The enclosure is heated to a temperature such that the contents are subjected to isothermal vapor-phase epitaxy in three-phase equilibrium resulting in the formation of $A_{1-x}B_xC$ epitaxial layer having a thickness $T_3$.

Next, the sapphire substrate with the $A_{1-x}B_xC$ epitaxial layer thereon and another source comprising an off-stoichiometric melt composed of either A, B, B' and C elements (in the case of the first quaternary compound) or A, B, C and C' elements (second quaternary compound), wherein A is Hg and B, B', C and C' are as defined previously, are subjected to isothermal vapor-phase epitaxy in three-phase equilibrium, resulting in the formation of either an $(A_{1-x}B_x)_{1-y}B'_yC$ or an $A_{1-x}B_xC_{1-z}C'_z$ epitaxial layer.

It is assumed that the lattice constant of the $A_{1-x}B_xC$ epitaxial layer having a thickness $T_3$ is $a_3$, and further that the thickness and lattice constant of the grown quaternary are $T_4$ and $a_4$ for the fist quaternary compound, and $T_4$, and $a_4$, for the second quaternary compound. Then $T_4$ and $T_{4'}$ are given respectively by the following equations:

$$T_4 = T_3 a_4/(1-y)a_3; \text{ and}$$

$$T_{4'} = T_3 a_{4'}/(1-z)a_3.$$

In determining the necessary elements for the intermediate $A_{1-x}B_xC$ ternary layer, it is a necessary condition that the dissociated pressure of the element B' is greater than that of the element B (first quaternary compound), and that the dissociation pressure of the element C' is greater than that of the element C (secondary quaternary) compound.

We claim:

1. A method for growing a $Hg_{1-x}Cd_xTe$ epitaxial layer on a substrate, where x is the mole fraction of CdTe in said $Hg_{1-x}Cd_xTe$ epitaxial layer, said method comprising:

providing a substrate that is formed from a material which does not interdiffuse with a semiconductor layer deposited thereon;

forming a CdTe layer on said substrate;

providing a Te-rich Hg-Cd-Te source expressed by $(Hg_{1-z}Cd_z)_{1-y}Te_y$, wherein y is the mole fraction of Te, $z(1-y)$ is the mole fraction of Cd and $(1-z)(1-y)$ is the mole fraction of Hg in said Te-rich Hg-Cd-Te source;

placing said source and said substrate with the CdTe layer thereon in an enclosure;

heating said source and said substrate with the CdTe layer thereon in said enclosure;

independently controlling the temperature of the substrate and the temperature of the source so as to establish three-phase equilibrium conditions in said enclosure, the temperature of the source being controlled to provide a stoichiometric $Hg_{1-x'}Cd_{x'}Te$ solid phase and a Te-rich HgCdTe liquid phase in said source and the temperature of the substrate being controlled to cause isothermal growth forming a $Hg_{1-x}Cd_xTe$ layer on said substrate by transportation of vapors from the source to said CdTe layer on the substrate, said x' being the mole fraction of CdTe in said stoichiometric solid phase; and maintaining said three-phase equilibrium conditions in said enclosure until the entirety of said CdTe layer is converted into said $Hg_{1-x}Cd_xTe$ epitaxial layer.

2. A method of growing a $Hg_{1-x}Cd_xTe$ epitaxial layer as set forth in claim 1, wherein the temperature of said substrate and the temperature of said source are the same, and the composition of the grown $Hg_{1-x}Cd_xTe$ epitaxial layer on the substrate is the same as the composition of the stoichiometric $Hg_{1-x'}Cd_{x'}Te$ solid phase included in the source.

3. A method of growing a $Hg_{1-x}Cd_xTe$ epitaxial layer as set forth in claim 1, wherein the temperature of said substrate and the temperature of said source are controlled within a range between 480° C. and 600° C.

4. A method of growing a $Hg_{1-x}Cd_xTe$ epitaxial layer as set forth in claim 1 wherein y is greater than 0.7.

5. A method of growing a $Hg_{1-x}Cd_xTe$ epitaxial layer as set forth in claim 1, wherein said substrate is formed from sapphire, magnesium oxide, zirconium oxide, magnesium aluminum oxide or a layer of silicon coated with silicon oxide.

6. A method of growing a $Hg_{1-x}Cd_xTe$ epitaxial layer as set forth in claim 1, wherein said three phase equilibrium conditions are continued until said $Hg_{1-x}Cd_xTe$ epitaxial layer on the substrate has a thickness which equals $ta_2/xa_1$ where $a_1$ and $a_2$ are the respective lattice constants of said CdTe layer and said $Hg_{1-x}Cd_xTe$ epitaxial layer and t is the original thickness of said CdTe layer.

7. A method of growing a $Hg_{1-x}Cd_xTe$ epitaxial layer as set forth in claim 1, wherein the temperature of said source is controlled to be lower than the temperature of said substrate, whereby the value of x in the grown $Hg_{1-x}Cd_xTe$ epitaxial layer is larger than the value of x' in the stoichiometric $Hg_{1-x'}Cd_{x'}Te$ solid phase in the source.

8. A method of growing a $Hg_{1-x}Cd_xTe$ spitaxial layer as set forth in claim 1, wherein said CdTe layer is patterned by selective removal of portions thereof to expose said substrate prior to growing of said spitaxial $Hg_{1-x}Cd_xTe$ layer, whereby said $Hg_{1-x}Cd_xTe$ spitaxial layer is patterned.

* * * * *

UNITED STATES PATENT AND TRADEMARK OFFICE
CERTIFICATE OF CORRECTION

PATENT NO. : 5,399,503
DATED : March 21, 1995
INVENTOR(S) : TETSUO SAITO et al.

It is certified that error appears in the above-indentified patent and that said Letters Patent is hereby corrected as shown below:

Title Page, column 2, line 17, delete "vaport" and substitute --vapor--.

Column 1, lines 18 and 19, "2. Description of the Related Art" and substitute --2. Description of the Related Art-- (sub-heading).

Column 5, line 61, delete "500°C" and substitute --550°C--.

Column 7, line 4, delete "Ps" and substitute --$P_B$--.

Column 10, line 8, delete "$Hg_{1-x-z}Dc_xZn_zTe$" and substitute --$Hg_{1-x-z}Cd_xZn_zTe$--.

Signed and Sealed this

Thirtieth Day of May, 1995

Attest:

BRUCE LEHMAN

Attesting Officer     Commissioner of Patents and Trademarks